US012748161B2

(12) United States Patent
Nishioka

(10) Patent No.: US 12,748,161 B2
(45) Date of Patent: Sep. 29, 2026

(54) ABNORMALITY DETECTION METHOD AND ABNORMALITY DETECTION DEVICE

(71) Applicant: TOYOTA JIDOSHA KABUSHIKI KAISHA, Toyota (JP)

(72) Inventor: Kosuke Nishioka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 161 days.

(21) Appl. No.: 18/782,227

(22) Filed: Jul. 24, 2024

(65) Prior Publication Data

US 2025/0130289 A1 Apr. 24, 2025

(30) Foreign Application Priority Data

Oct. 19, 2023 (JP) ................................ 2023-180132

(51) Int. Cl.

*G01R 31/396* (2019.01)
*G01R 31/378* (2019.01)
*G01R 31/3842* (2019.01)
*H01M 10/42* (2006.01)

(52) U.S. Cl.

CPC ......... *G01R 31/396* (2019.01); *G01R 31/378* (2019.01); *G01R 31/3842* (2019.01); *H01M 10/4285* (2013.01)

(58) Field of Classification Search

CPC ................ G01R 31/396; G01R 31/378; G01R 31/3842; G01R 31/392; G01R 31/382-388; H01M 10/4285

See application file for complete search history.

(56) References Cited

U.S. PATENT DOCUMENTS 6,304,059 B1 * 10/2001 Chalasani ................. H02J 7/34 320/118
9,274,178 B2 * 3/2016 Zhang .................. G01R 31/389
2024/0085483 A1 * 3/2024 Shen .................... G01R 31/374

FOREIGN PATENT DOCUMENTS

JP 2023-161796 A 11/2023

* cited by examiner

*Primary Examiner* — Lee E Rodak
*Assistant Examiner* — Demetrius R Pretlow
(74) *Attorney, Agent, or Firm* — SoraIP, Inc.

(57) ABSTRACT

An abnormality detection method of a sub battery (LFP type battery) for backing up a main battery that includes the steps of charging the sub battery to a fully charged state, discharging a predetermined current amount from the fully charged sub battery, maintaining the sub battery in a state where the current becomes equal to or less than a predetermined value until a predetermined time elapses, discharging a detection current for detecting an abnormality of the sub battery from the sub battery after a predetermined time elapses, calculating a voltage drop amount, which is a difference between the cell voltage at the start of discharge of the detection current and the cell voltage at the end of discharge, for a plurality of battery cells constituting the sub battery, respectively, and determining that the sub battery is abnormal.

3 Claims, 4 Drawing Sheets

ABNORMALITY DETECTION METHOD AND ABNORMALITY DETECTION DEVICE

CROSS-REFERENCE TO RELATED APPLICATION

This application claims priority to Japanese Patent Application No. 2023-180132 filed on Oct. 19, 2023, incorporated herein by reference in its entirety.

BACKGROUND

1. Technical Field

The present disclosure relates to a method and a device of detecting an abnormality of a sub battery that backs up a main battery.

2. Description of Related Art

Japanese Patent Application No. 2022-072365 discloses a vehicle battery control device that detects an abnormality of a sub battery that backs up a main battery. In the vehicle battery control device, a detection current for detecting an abnormality of the sub battery is discharged. After that, a voltage drop amount is calculated for each of a plurality of battery cells that constitutes the sub battery, by making a comparison between the voltage of the battery cell before discharging the detection current and the voltage of the battery cell after discharging the detection current. It is determined that the sub battery is abnormal when the difference between the voltage drop amount of each battery cell and the voltage drop amount of another battery cell is equal to or greater than a threshold value.

SUMMARY

Japanese Patent Application No. 2022-072365 provides a technique of determining the presence or absence of an anomaly in a battery based on a cell voltage that varies along with a change in a state of charge (SOC) of the battery. This technique is effective for a ternary lithium-ion battery or the like in which a change in an open circuit voltage (OCV) according to the state of charge SOC of the battery is easily seeable. However, it is difficult to apply this technique to an iron phosphate-based lithium-ion battery (LFP battery) having a flat area in a so-called SOC-OCV property, in which the change in the open circuit voltage OCV according to the state of charge SOC of the battery is not easily seeable.

The present disclosure has been made in view of the above issue, and an object of the present disclosure is to provide a method and a device of detecting an abnormality of a battery that are effective in application to an iron phosphate-based lithium-ion battery or the like.

In order to address the above issue, an aspect of the present disclosure provides an abnormality detection method of detecting an abnormality of a sub battery as an iron phosphate-based lithium-ion battery that backs up a main battery, including: charging the sub battery to a fully charged state; discharging a predetermined amount of current from the sub battery in the fully charged state; maintaining the sub battery in a state in which a current is a predetermined value or less until a predetermined time elapses after the predetermined amount of current is discharged; discharging a detection current for detecting an abnormality of the sub battery from the sub battery after the predetermined time elapses; calculating a voltage drop amount for each of a plurality of battery cells that constitutes the sub battery, the voltage drop amount being a difference between a cell voltage at a start of discharge of the detection current and a cell voltage at an end of the discharge; and determining that the sub battery is abnormal when a difference between any two of a plurality of voltage drop amounts calculated is equal to or greater than a predetermined threshold value.

With the abnormality detection method according to the present disclosure, it is possible to effectively detect an abnormality even when applied to an iron phosphate-based lithium-ion battery or the like.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

The abnormality detection method includes: charging the sub battery to a fully charged state; and pre-discharging the sub battery to a state of charge SOC with a gradual change gradient of the voltage with respect to the state of charge SOC, and waiting for depolarization by discharging, and then performing an abnormality detection process on the sub battery. Therefore, even when the present disclosure is applied to an iron phosphate-based lithium-ion battery having a flat region, abnormality detection can be effectively performed. Hereinafter, an embodiment of the present disclosure will be described in detail with reference to the drawings.

EMBODIMENT

Configuration

Figure 1:
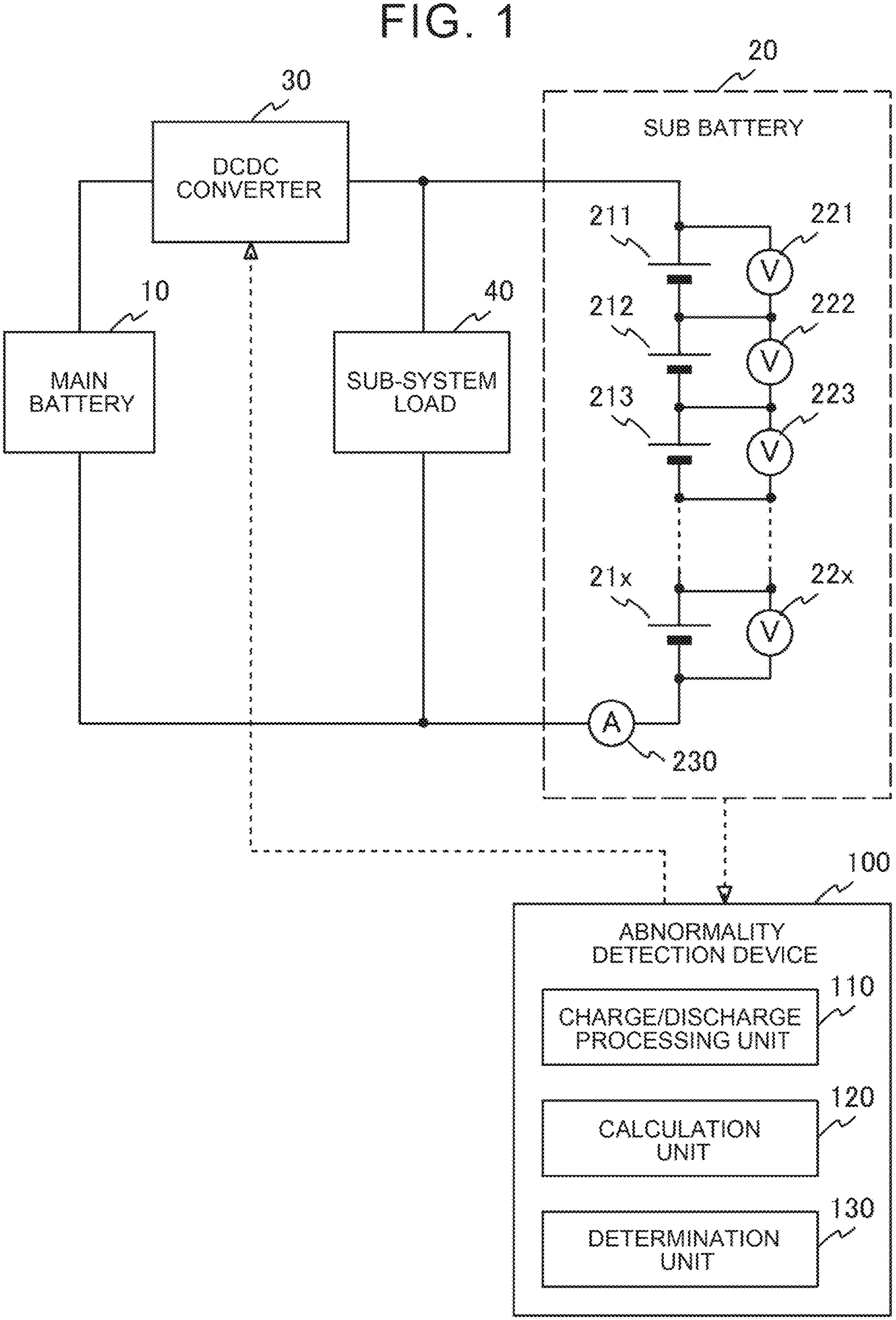
FIG. 1 is a functional block diagram of an abnormality detection device and a peripheral portion thereof according to an embodiment of the present disclosure.

FIG. 1 is a functional block diagram of an abnormality detection device 100 and a peripheral portion thereof according to an embodiment of the present disclosure. The functional block illustrated in FIG. 1 includes a main battery 10, a sub battery 20, a DCDC converter 30, a sub-system load 40, and an abnormality detection device 100.

The configuration of the control device 100 and the like illustrated in FIG. 1 can be mounted on vehicles such as hybrid electric vehicle (HEV), plug-in hybrid electric vehicle (PHEV), and battery electric vehicle (BEV) that implement functions requiring a redundant power supply configuration such as autonomous driving.

The main battery 10 is a rechargeable secondary battery such as a lead-acid battery or a lithium-ion battery. The main battery 10 supplies the electric power stored therein to a main load (a primary system device) (not shown) or outputs the electric power to DCDC converter 30. Further, the main battery 10 can store electric power output by a generator such as an alternator (not shown). The main battery 10 may constitute a power supply circuit together with a generator or the like that can serve as a power supply source.

Figure 2:
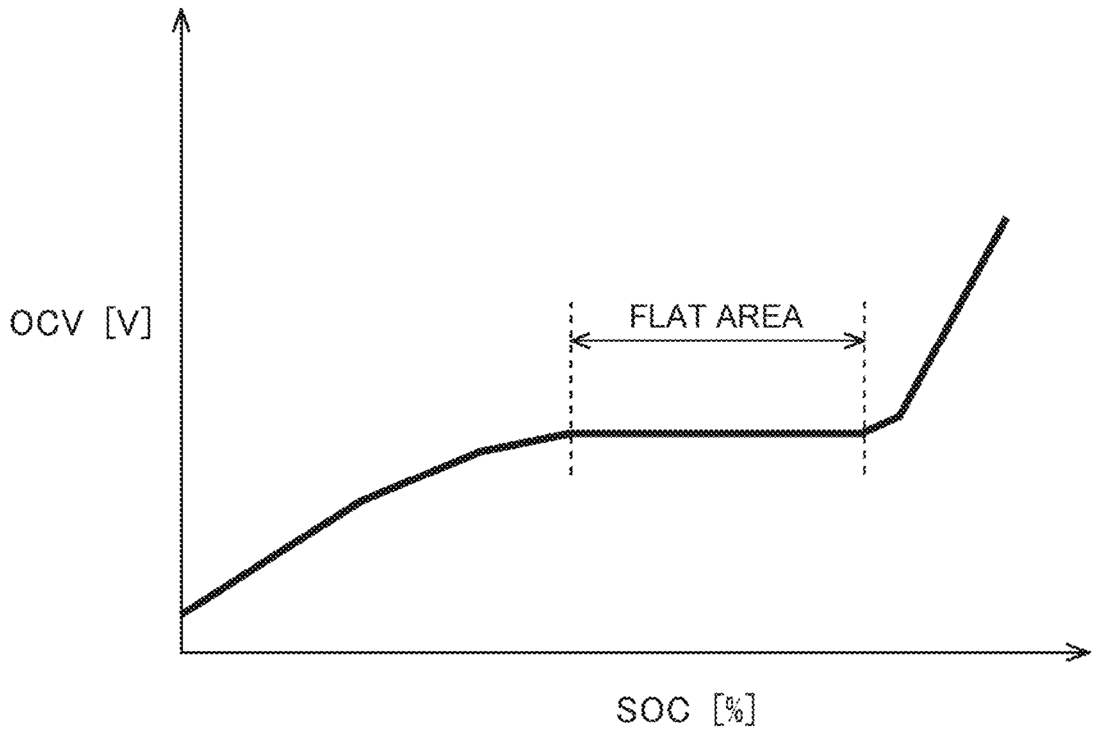
FIG. 2 is a diagram illustrating an exemplary SOC-OCV property of a sub battery.

The sub battery 20 is a chargeable/dischargeable secondary battery configured by connecting a plurality of battery cells 211 to 21*x* (x is an integer of 2 or more) in series. The sub battery 20 of the present embodiment is an iron phosphate-based lithium-ion battery having a flat area in SOC-OCV properties. FIG. 2 shows an exemplary SOC-OCV property of the sub battery 20. The sub battery 20 stores the electric power outputted from the main battery 10 via DCDC converter 30, and supplies the electric power stored therein to the sub-system load (secondary system device) 40. As an example, the sub battery 20 includes a backup function that maintains (continues) the power supply to the sub-system load 40 in place of the main battery 10 when a power failure occurs in the main battery 10.

The respective cell voltages of 21*x* from the plurality of battery cells 211 constituting the sub battery 20 can be detected by 22*x* from the plurality of voltage sensors 221, and the current of 21*x* from the plurality of battery cells 211 can be detected by the current sensor 230. 22*x* and current sensors 230 from the plurality of voltage sensors 221 may be provided in the sub battery 20 or may be provided outside the sub battery 20. 22*x* from the plurality of voltage sensors 221 and the value detected by the current sensor 230 (the state of the sub battery 20) are outputted to the abnormality detection device 100.

DCDC converter 30 is provided between the main battery 10 and the sub battery 20 and the sub-system load 40, and is a voltage converter for converting a voltage of the main battery 10 to be inputted into a voltage required for the sub battery 20 and the sub-system load 40 and outputting the voltage. DCDC converter 30 may be, for example, a step-down type DCDC converter in which the voltage of the main battery 10 is stepped down and outputted to the sub battery 20 and the sub-system load 40. DCDC converter 30 is configured to be controllable by the abnormality detection device 100.

The sub-system load 40 is an in-vehicle device that operates with electric power supplied from the main battery 10 or electric power supplied from the sub battery 20 via DCDC converter 30 using the main battery 10 as a main power source and the sub battery 20 as a redundant power source. The sub-system load 40 includes a load that requires a redundant power supply configuration such as an in-vehicle device that is important for safe driving of the vehicle. A load that does not require a redundant power supply configuration in particular may be included in the sub-system load 40.

The abnormality detection device 100 is configured to detect an abnormality occurring in the sub battery 20 and determine whether the sub battery 20 is normal or abnormal. The abnormality of the sub battery 20 is, for example, a case where the main battery 10 cannot be backed up in an emergency such as a failure of the main battery 10. The abnormality detection device 100 includes a charge/discharge processing unit 110, a calculation unit 120, and a determination unit 130.

The charge/discharge processing unit 110 controls DCDC converter 30 to control the charge/discharge operation of the sub battery 20. In the present embodiment, as the charging and discharging operation, a first operation (pre-charging and discharging process) for bringing the state of the sub battery 20 into a state suitable for performing abnormality detection and a second operation (present charging and discharging process) for performing abnormality detection are performed. Details of the charge/discharge processing performed by the charge/discharge processing unit 110 will be described later.

The calculation unit 120 acquires the status of the sub battery 20 in the second operation, and calculates the difference (voltage drop difference) between the change (voltage drop amount) of the respective cell voltages of 21*x* and the change (voltage drop amount difference) of the cell voltages from the plurality of battery cells 211 constituting the sub battery 20. Details of the calculation processing performed by the calculation unit 120 will be described later.

The determination unit 130 determines whether or not an abnormality has occurred in the sub battery 20 based on the result (voltage drop amount and voltage drop amount difference) calculated by the calculation unit 120. Details of the determination process performed by the determination unit 130 will be described later.

A part or all of the abnormality detection device 100 may be configured by a processor such as a microcomputer, a memory, an Electronic Control Unit (ECU) including an input/output interface, and the like. The electronic control device can realize some or all of the functions performed by the components of the charge/discharge processing unit 110, the calculation unit 120, and the determination unit 130 by the processor reading and executing the program stored in the memory.

Control

Figure 3:
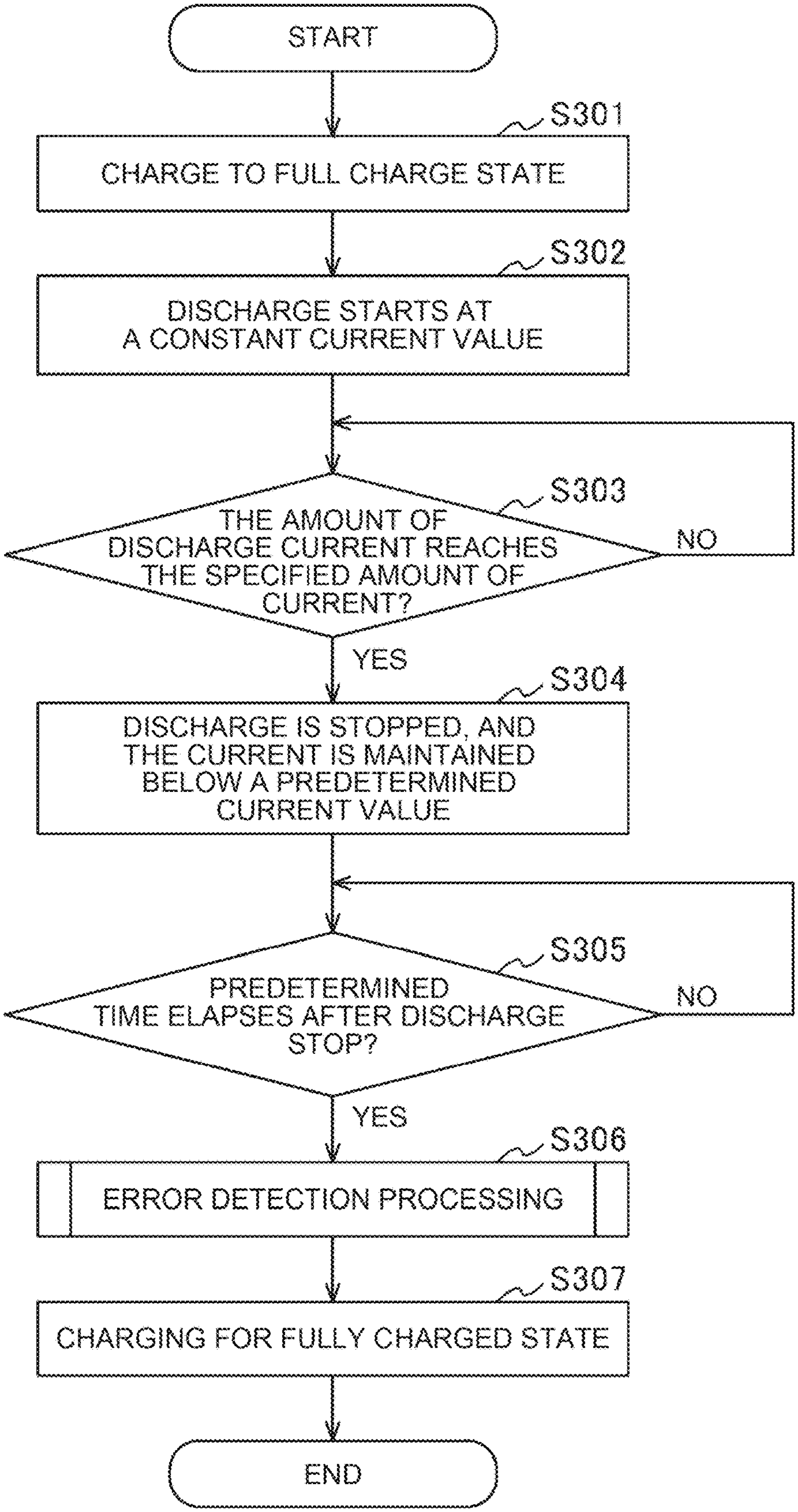
FIG. 3 is a flow chart for explaining a process of abnormality determination control of a sub battery.

Next, the control performed by the abnormality detection device 100 according to the present embodiment will be described with further reference to FIGS. 3 and 4. FIG. 3 is a flowchart illustrating a processing procedure of abnormality determination control of the sub battery 20 executed by the abnormality detection device 100.

The abnormality determination control of the sub battery 20 illustrated in FIG. 3 is started at a predetermined timing (for example, when the ignition of the vehicle is turned on or off).

S301

The charge/discharge processing unit 110 charges the sub battery 20 until the state of full charge is reached. The fully charged state can be judged by any cell voltage in 21*x* from the plurality of battery cells 211 constituting the sub battery 20 that becomes a voltage equivalent to the fully charged state (for example, 3.5 V). In addition, a fully charged state can be judged by a current flowing through 21*x* from the plurality of battery cells 211 that becomes a predetermined current value (for example, 0.8 A) or less etc. The voltage and the predetermined current value corresponding to the full charge can be arbitrarily set in accordance with the characteristics of the sub battery 20. When the sub battery 20 is fully charged, the process proceeds to S302.

S302

The charge/discharge processing unit 110 starts discharging a constant current value from the fully charged sub battery 20. This discharging is performed in order to change the state of charge SOC of the iron phosphate-based lithium-ion battery from the region where SOC-OCV property is steep to the region where the slope is gentle. The constant current value is arbitrarily set in accordance with the characteristics of the sub battery 20. When the charge/discharge processing unit 110 starts discharging the sub battery 20, the processing proceeds to S303.

S303

The charge/discharge processing unit 110 determines whether or not the total amount of currents discharged by the sub battery 20 (hereinafter referred to as "discharge current amount") has reached a predetermined current amount. The predetermined current amount is a current amount indicating that the state of charge SOC of the sub battery 20 has decreased to an area of a gradual gradient of SOC-OCV property. By discharging the sub battery 20 from the fully charged state by a predetermined amount of current, it is possible to equalize the properties of 21_x_ from the plurality of battery cells 211 when the sub battery 20 is normal. When it is determined that the discharging current amount has reached the predetermined current amount (S303, Yes), the process proceeds to S304.

S304

The charge/discharge processing unit 110 stops discharging of a constant current value from the sub battery 20, and maintains a state in which the current flowing from the sub battery 20 becomes equal to or less than a predetermined current value. This state is maintained in order to eliminate the polarization caused by the discharge generated in the sub battery 20. The predetermined current value is arbitrarily set in accordance with the characteristics of the sub battery 20, but is desirably zero. When discharging from the sub battery 20 is stopped and the current of the sub battery 20 is maintained below a predetermined current, the process proceeds to S305.

S305

The charge/discharge processing unit 110 determines whether or not a predetermined time has elapsed since the discharge of the sub battery 20 was stopped. This determination is made to determine whether or not the polarization of the sub battery 20 has been eliminated. Therefore, the predetermined time is set to a time (for example, one minute) in which the polarization is estimated to be sufficiently eliminated in consideration of the characteristics of the sub battery 20, the balance with the accuracy of the required abnormality detection, and the like. When it is determined that a predetermined period of time has elapsed since the sub battery 20 was stopped (S305, Yes), the process proceeds to S306.

The above-described processes from S301 to S305 correspond to a first operation (pre-charge/discharge process) for bringing the state of the sub battery 20 into a state suitable for performing anomaly detection.

S306

The calculation unit 120 and the determination unit 130 perform abnormality detection processing for determining whether the sub battery 20 is normal or abnormal. This abnormality detection process corresponds to the second operation (this charge/discharge process). Details of the abnormality detection process will be described later with reference to FIG. 4. When the anomaly detection processing is performed by the calculation unit 120 and the determination unit 130, the processing proceeds to S307.

S307

The charge/discharge processing unit 110 performs charging of the sub battery 20 toward a fully charged state in accordance with the outcome of the anomaly detection processing in S306. More specifically, in a case where it is determined that the sub battery 20 is normal, in a case where the detection and discharge of the sub battery 20 is not successful (described later), or in a case where the detection precondition is not satisfied (described later), the sub battery 20 is charged toward a fully charged state. Even when it is determined that the sub battery 20 is abnormal, the sub battery 20 may be charged toward a fully charged state as long as the abnormality does not affect the safe running of the vehicle. When charging of the sub battery 20 toward the fully charged state is performed by the charge/discharge processing unit 110, the abnormality determination control of the sub battery 20 ends.

Figure 4:
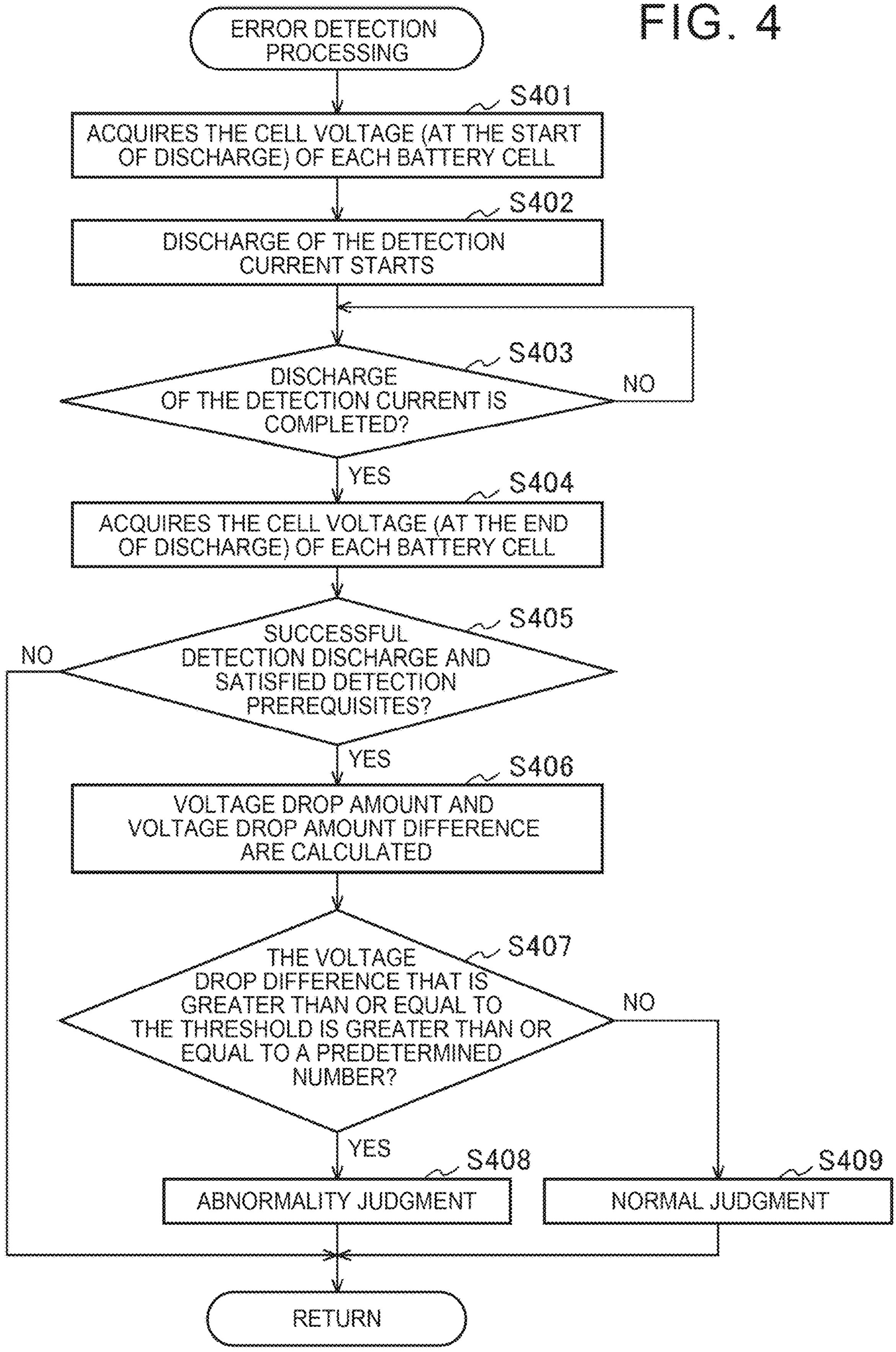
FIG. 4 is a flowchart for explaining a detailed procedure of the abnormality detection process.

Abnormality Detection Process (FIG. 4)

FIG. 4 is a flow chart for explaining a detailed sequence of the anomaly detection process (S306) in FIG. 3.

S401

The calculation unit 120 acquires 21_x_ cell voltages from the plurality of battery cells 211 constituting the sub battery 20 when the discharge of the sub battery 20 by the charge/discharge processing unit 110 is started. When the calculation unit 120 acquires the respective cell voltages (at the time of starting discharging) of 21_x_ from the plurality of battery cells 211, the process proceeds to S402.

S402

The charge/discharge processing unit 110 discharges a detection current for detecting an abnormality of the sub battery 20 from the sub battery 20. The current amount and the discharge time of the detection current are arbitrarily set in accordance with the characteristics of the sub battery 20. When discharging of the detection current is started from the sub battery 20, the process proceeds to S403.

S403

The charge/discharge processing unit 110 determines whether or not the discharge of the detection current from the sub battery 20 has ended. The end of the discharge can be determined by the lapse of a predetermined discharge time. When discharging of the detection current from the sub battery 20 is completed, the process proceeds to S404.

S404

The calculation unit 120 acquires the respective cell voltages of 21_x_ from the plurality of battery cells 211 constituting the sub battery 20 when the discharge of the sub battery 20 by the charge/discharge processing unit 110 ends. When the calculation unit 120 acquires the cell voltages (at the end of discharging) of 21_x_ from the plurality of battery cells 211, the process proceeds to S405.

S405

The determination unit 130 determines whether or not the detection discharge of the sub battery 20 is successful and the detection precondition is satisfied. This determination can be made based on whether or not the detected current flows by a predetermined threshold value or more, and whether or not the temperature and/or the state of charge SOC of the sub battery 20 are within a predetermined detection range. Further, this determination can be made based on whether or not there is no variation in the temperature difference in the battery pack (within a predetermined threshold value), whether or not there is no variation in the difference in the state of charge SOC for each 21_x_ from the battery cell 211 (within a predetermined threshold value), whether or not 22_x_ and the current sensor 230 are normal from the plurality of voltage sensors 221, and the like. When the determination unit 130 determines that the detection and discharging of the sub battery 20 is successful and the detection precondition is satisfied (S405, Yes), the process proceeds to S406. On the other hand, when the determination unit 130 is unable to determine that the detection and discharging of the sub battery 20 has succeeded and the detection precondition has been satisfied (S405, No), the anomaly detection process of the sub battery 20 ends (return to S307 of FIG. 3).

S406

The calculation unit 120 calculates a voltage drop amount and a voltage drop amount difference based on the respective cell voltages acquired by S401 and S404, respectively. The voltage drop amount dVn indicates a voltage amount of the cell voltage of the battery cell 21*n* (n=1 to x) decreased by the detection discharging. The voltage drop dVn is a voltage (Vcsn−Vcen) obtained by subtracting the cell voltage Vcen at the end of discharge from the cell voltage Vcsn at the start of discharge. The voltage drop difference ΔdVn indicates a difference in the cell voltage between the plurality of battery cells 211 and 21*x*. The voltage drop difference ΔdVn is typically the absolute difference (|dVn−dVm|) between the voltage drop amount dVn of two battery cells 21*n* that are electrically adjoining each other and the voltage drop amount dVm of the battery cell 21*m* (m=n−1). Note that the battery cell 21*x* at the end of the sub battery 20 can obtain a voltage-drop differential ΔdVx(=|dVx−dV1|) with the first battery cell 211. Note that the voltage-drop differential ΔdVn can be obtained under any condition other than two neighboring battery cells. When the voltage drop amount is calculated by the calculation unit 120 and the voltage drop amount difference is calculated from the voltage drop amount, the process proceeds to S407.

S407

The determination unit 130 determines whether or not a voltage drop amount difference that is equal to or greater than a predetermined threshold value is equal to or greater than a predetermined number of voltage drop amount differences among the voltage drop amount differences calculated by S406. This determination is to determine the number of variations in the cell voltage, and the predetermined threshold value and the predetermined number can be arbitrarily set based on the performance or the like required for the sub battery 20. When the determination unit 130 determines that there are a predetermined number or more of voltage drop differences that are equal to or larger than a predetermined threshold value (S407, Yes), the process proceeds to S408. On the other hand, when the determination unit 130 determines that the voltage drop amount difference that is equal to or larger than the predetermined threshold value is not equal to or larger than the predetermined number (S407, No), the process proceeds to S409.

S408

The determination unit 130 determines that an abnormality has occurred in the sub battery 20 (abnormality determination). When the abnormality determination is made on the sub battery 20, the abnormality detection process of the sub battery 20 ends (S307 returns to FIG. 3).

S409

The determination unit 130 determines that the sub battery 20 is normal (normal determination). When the sub battery 20 is determined to be normal, the abnormality detection process of the sub battery 20 ends (S307 of FIG. 3 returns).

Operations and Effects

According to the above-described abnormality detection method and apparatuses according to an embodiment of the present disclosure, after the sub battery is temporarily charged to a fully charged state in which the state of the battery is determined, the sub battery is pre-discharged to a state of charge SOC in which the voltage gradient of SOC-OCV property is gentle in order to prevent erroneous detection due to the collapse of the cell balance. Further, after waiting for the elimination of the polarization associated with the pre-discharge, an abnormality detection process is performed on the sub battery.

Therefore, the abnormality detection method according to an embodiment of the present disclosure can effectively perform the anomaly detection even when the anomaly detection method is applied to an iron phosphate-based lithium-ion battery or the like having a flat area in which the change in the voltage with respect to the variation in the state of charge SOC hardly appears in SOC-OCV property.

Although an embodiment of the present disclosure has been described above, the present disclosure can be regarded not only as the above-described abnormality detection method and abnormality detection device, but also as a program for causing a computer to execute the abnormality detection method, a computer-readable non-transitory recording medium storing the program, or a vehicle equipped with an abnormality detection device.

The abnormality detection method and the abnormality detection device of the present disclosure can be used for a vehicle or the like including a sub battery that backs up a main battery.

What is claimed is:

1. An abnormality detection method of detecting an abnormality of a sub battery as an iron phosphate-based lithium-ion battery that backs up a main battery, the abnormality detection method comprising:

charging the sub battery to a fully charged state;

discharging a predetermined amount of current from the sub battery in the fully charged state;

maintaining the sub battery in a state in which a current is a predetermined value or less until a predetermined time elapses after the predetermined amount of current is discharged;

discharging a detection current for detecting an abnormality of the sub battery from the sub battery after the predetermined time elapses;

calculating a voltage drop amount for each of a plurality of battery cells that constitutes the sub battery, the voltage drop amount being a difference between a cell voltage at a start of discharge of the detection current and a cell voltage at an end of the discharge; and determining the abnormality of the sub battery based on whether a difference between any two of a plurality of voltage drop amounts calculated is equal to or greater than a predetermined threshold value, wherein a determination is made that the sub battery is abnormal when the number of differences in the voltage drop amount that are equal to or greater than the predetermined threshold value exceeds a predetermined number.

2. An abnormality detection device that detects an abnormality of a sub battery as an iron phosphate-based lithium-ion battery that backs up a main battery, the abnormality detection device comprising:

a charging unit that charges the sub battery to a fully charged state;

a discharging unit that discharges a predetermined amount of current from the sub battery in the fully charged state and discharges a detection current for detecting the abnormality of the sub battery from the sub battery after a predetermined time elapses after the predetermined amount of current is discharged from the sub battery;

a processing unit that maintains the sub battery in a state in which a current is a predetermined value or less until the predetermined time elapses after the predetermined amount of current is discharged from the sub battery;

a calculation unit that calculates a voltage drop amount for each of a plurality of battery cells that constitutes the sub battery, the voltage drop amount being a difference between a cell voltage at a start of discharge of the detection current and a cell voltage at an end of the discharge; and a determination unit that determines the abnormality of the sub battery based on whether a difference between any two of a plurality of voltage drop amounts calculated is equal to or greater than a predetermined threshold value, wherein the determination unit determines that the sub battery is abnormal when the number of differences in the voltage drop amount that are equal to or greater than the predetermined threshold value exceeds a predetermined number.

3. The abnormality detection device according to claim 2, wherein the difference between any two of the voltage drop amounts is a difference between the voltage drop amounts of two battery cells that are electrically adjacent to each other.

* * * * *